United States Patent
Miyazawa

(10) Patent No.: US 8,710,501 B2
(45) Date of Patent: Apr. 29, 2014

(54) ELECTRO-OPTICAL DEVICE, METHOD OF MANUFACTURING THE SAME, AND ELECTRONIC APPARATUS

(75) Inventor: Takashi Miyazawa, Hokuto (JP)

(73) Assignee: Seiko Epson Corporation, Tokyo (JP)

( * ) Notice: Subject to any disclaimer, the term of this patent is extended or adjusted under 35 U.S.C. 154(b) by 1358 days.

(21) Appl. No.: 11/271,836

(22) Filed: Nov. 14, 2005

(65) Prior Publication Data

US 2006/0124940 A1 Jun. 15, 2006

(30) Foreign Application Priority Data

Dec. 14, 2004 (JP) ................................. 2004-361760

(51) Int. Cl.
- *H01L 29/04* (2006.01)
- *H01L 29/10* (2006.01)
- *H01L 31/00* (2006.01)

(52) U.S. Cl.
USPC ............. 257/59; 438/70; 438/73; 438/149; 438/151; 438/301; 438/725; 438/738; 438/584; 349/69; 349/74; 349/78; 349/80; 349/96; 349/97; 349/104; 349/106; 349/108

(58) Field of Classification Search
USPC ............ 349/69, 74, 78, 80, 96, 97, 104, 106, 349/108; 257/59; 438/70–73, 149, 151, 438/301, 725, 738, 584, 587, 760, 761, 789
See application file for complete search history.

(56) References Cited

U.S. PATENT DOCUMENTS

| | | | |
|---|---|---|---|
| 4,666,728 A | 5/1987 | Pittet et al. | |
| 6,692,983 B1 * | 2/2004 | Chen et al. | 438/70 |
| 6,894,432 B2 | 5/2005 | Fujieda et al. | |
| 6,911,772 B2 | 6/2005 | Cok | |
| 7,166,872 B2 | 1/2007 | Miyazawa | |
| 2003/0113639 A1 * | 6/2003 | Kawase | 430/7 |
| 2004/0041783 A1 * | 3/2004 | Lee et al. | 345/102 |
| 2004/0080920 A1 * | 4/2004 | Miyazawa | 361/781 |
| 2004/0189588 A1 * | 9/2004 | Dong et al. | 345/102 |
| 2004/0227197 A1 * | 11/2004 | Maekawa | 257/410 |
| 2005/0048224 A1 * | 3/2005 | Araya et al. | 428/1.3 |
| 2005/0059169 A1 * | 3/2005 | Hattori | 436/518 |

FOREIGN PATENT DOCUMENTS

| | | |
|---|---|---|
| CN | 1450387 A | 10/2003 |
| JP | A-2002-202737 | 7/2002 |
| JP | A-2004-22541 | 1/2004 |
| JP | A-2004-134122 | 4/2004 |
| WO | A-2004-87531 | 3/2004 |

OTHER PUBLICATIONS

Mitsuhiro Kashiwabara et al., "Adobanced AM-OLED Display Based on White Emitter with Microcavity Structure," SID Symposium Digest of Technical Papers, USA, Society for Information Display, vol. 35, No. 2, pp. 1017-1019, May 2004.

* cited by examiner

*Primary Examiner* — Meiya Li
(74) *Attorney, Agent, or Firm* — Oliff PLC

(57) ABSTRACT

An electro-optical device includes a light-emitting layer provided with a white light-emitting element; and a reflective filter layer that is located at one side of the light-emitting layer and is provided with a reflective color filter.

3 Claims, 11 Drawing Sheets

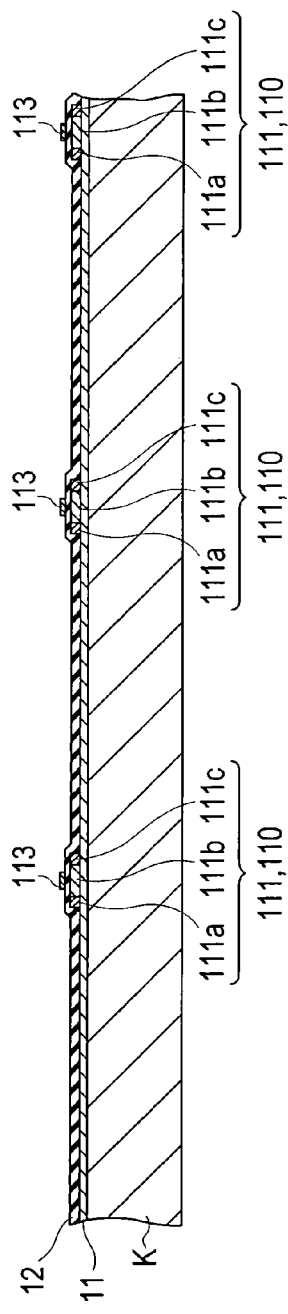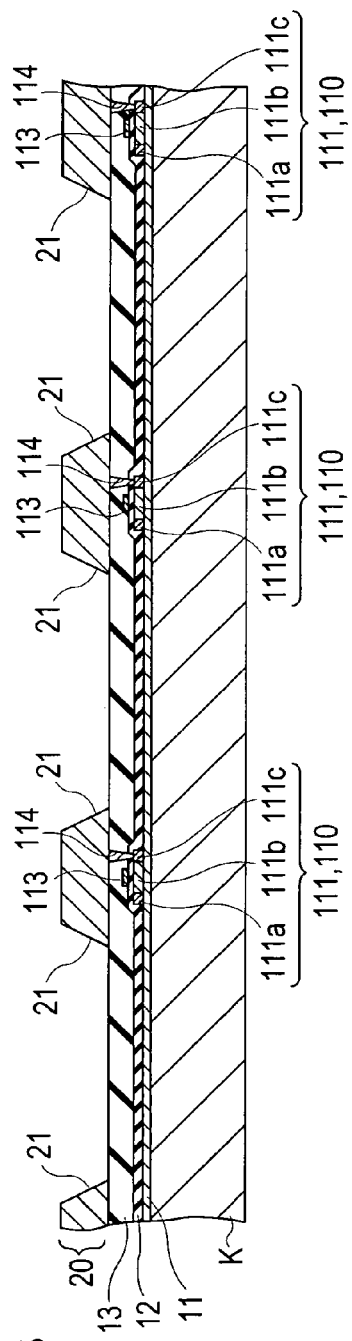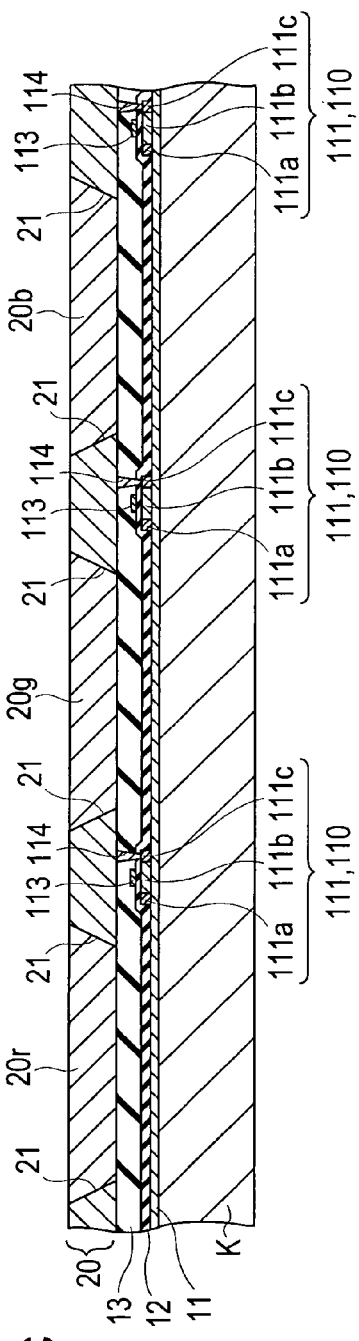

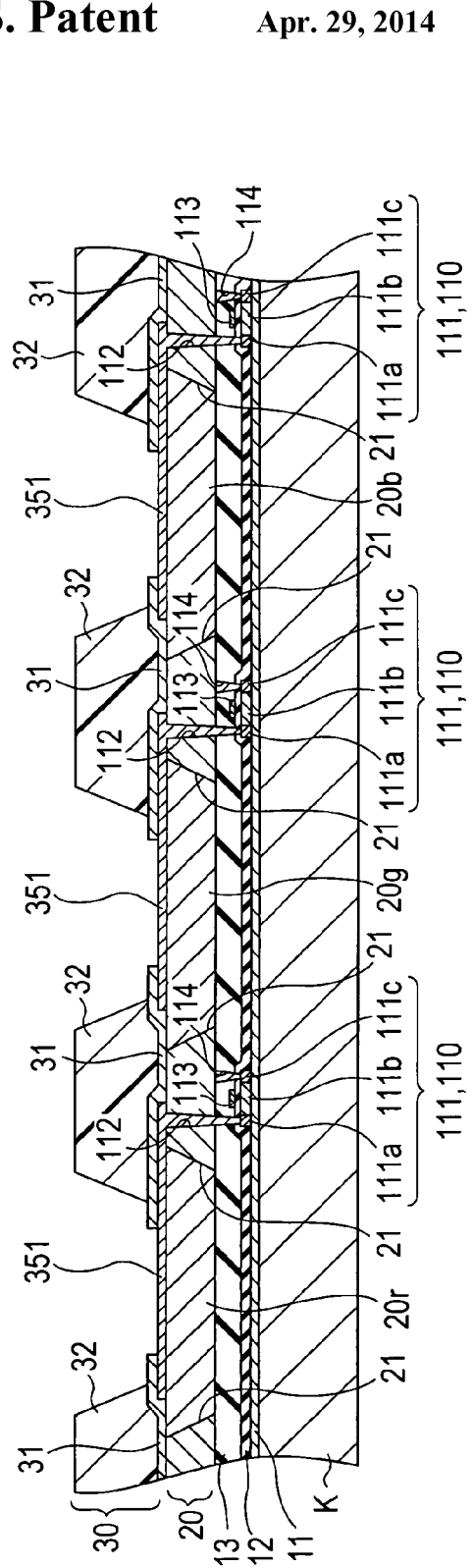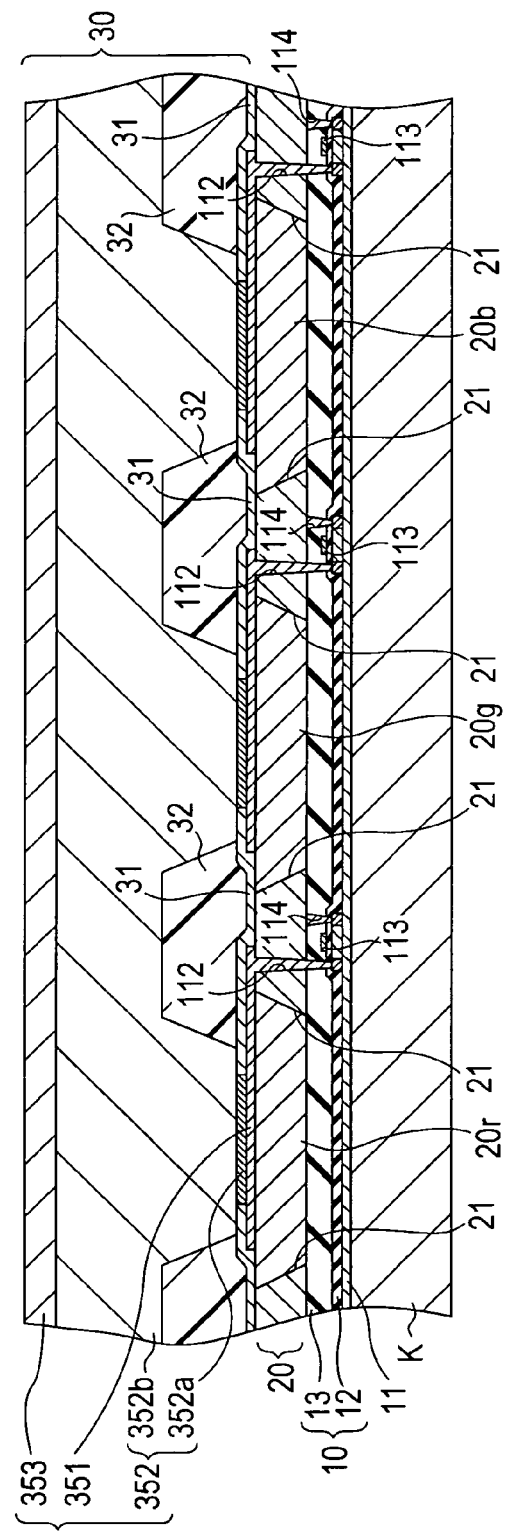

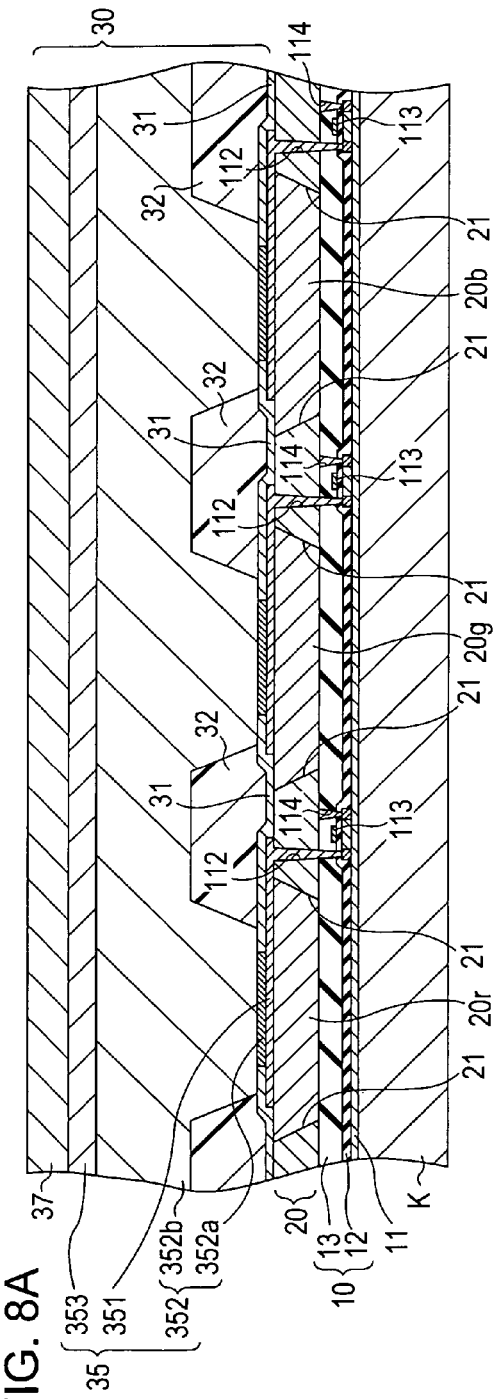
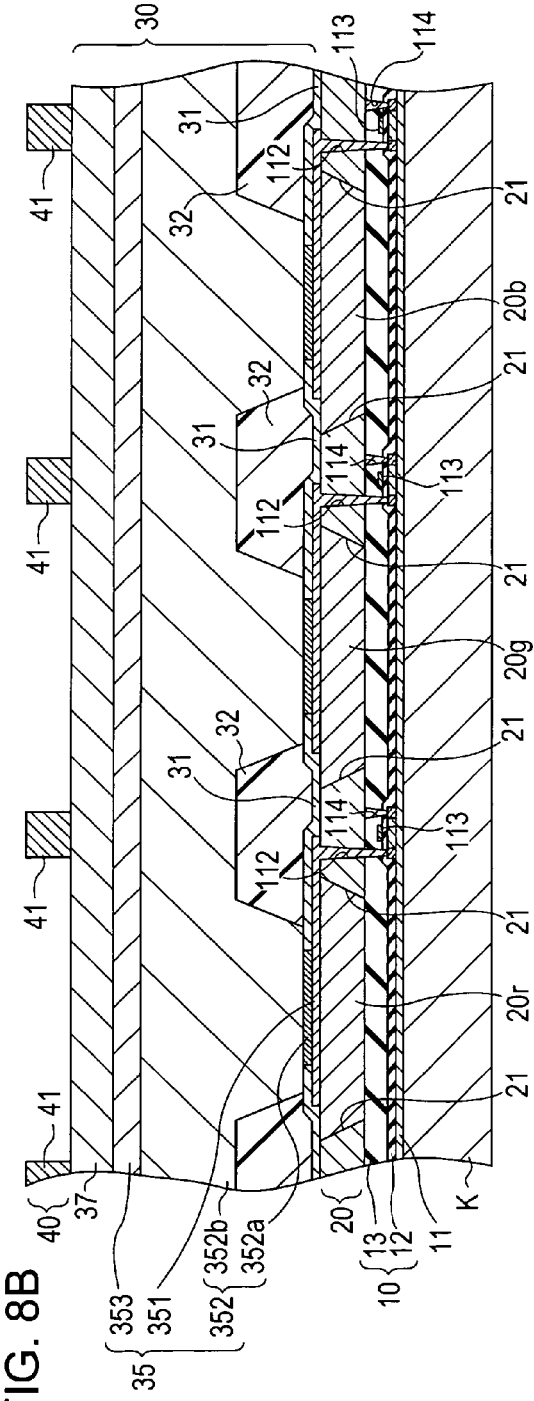
FIG. 8A
FIG. 8B

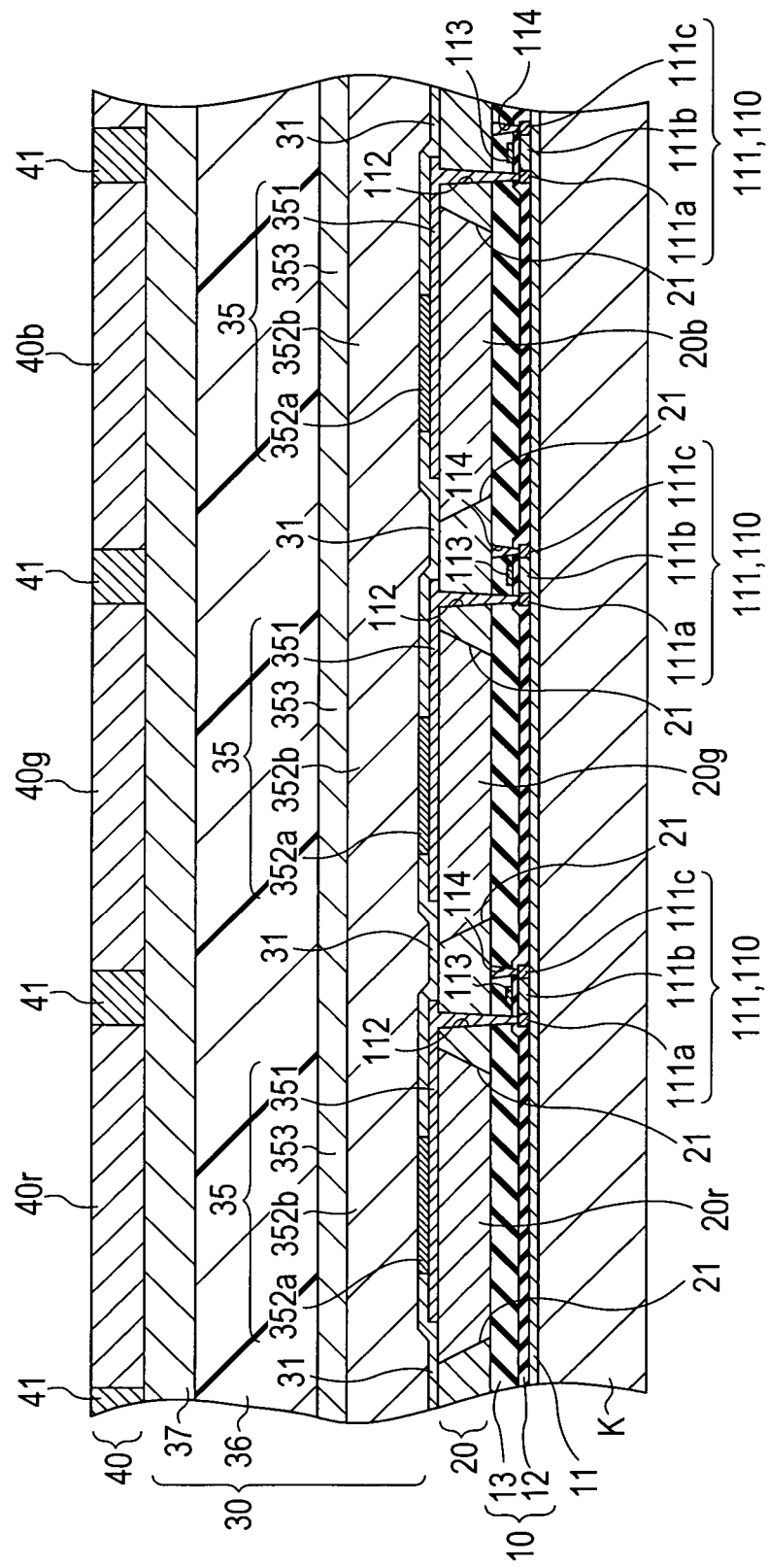

ELECTRO-OPTICAL DEVICE, METHOD OF MANUFACTURING THE SAME, AND ELECTRONIC APPARATUS

BACKGROUND

1. Technical Field

The present invention relates to an electro-optical device capable of performing color display, to a method of manufacturing the same, and to an electronic apparatus.

2. Related Art

A device having an organic light-emitting diode element (hereinafter, referred to as 'OLED element') has been drawing attention as an image display device that replaces a liquid crystal display device. The OLED element is a current-driving-type self-luminous element, unlike a liquid crystal element in which the amount of light to be transmitted varies.

In recent years, the screen size has been made large, and this has also been applied to an image display device using the OLED element. In a case in which the image display device is manufactured by a mask evaporation method, there is a problem in that precise patterning cannot be performed due to twisting of the mask or the like. A technique for realizing color display by combining a white OLED element with microcavities and using a color filter, instead of the mask evaporation is disclosed in Mitsuhiro Kashiwabara et al., "Adobanced AM-OLED Display Based on White Emitter with Microcavity Structure", SID Symposium Digest of Technical Papers, USA, Society for Information Display, vol. 35, No. 2, pp. 1017-1019, May, 2004 (FIG. 1).

However, the wavelength characteristic of a microcavity is determined by its optical length or the like. Therefore, the film thickness of a pixel electrode is required to be precisely controlled in order to obtain a characteristic corresponding to each of the red, green, and blue colors, which causes the manufacturing process to be complicated.

SUMMARY

An advantage of some aspects of the invention is that it provides an electro-optical device using a white light-emitting element that can be simply manufactured, a method of manufacturing the same, and an electronic apparatus.

According to an aspect of the invention, an electro-optical device includes a light-emitting layer provided with white light-emitting elements; and a reflective filter layer that is located at one side of the light-emitting layer and is provided with a reflective color filter. According to the invention, a light emitted from the light-emitting layer is reflected by the reflective color filter, which makes it possible to perform color display. In this case, since it is not necessary to precisely control the film thickness unlike a case in which a micro cavity is used, the configuration can become simple.

Further, it is preferable that the electro-optical device further include a transmissive filter layer that is located on the other side of the light-emitting layer and is provided with a transmissive color filter. According to the invention, the light-emitting layer is interposed between the reflective filter layer and the transmissive filter layer, so that it is possible to improve the colorimetric purity and to increase the light-emitting efficiency.

Here, it is preferable that the reflective filter layer include a plurality of microphase-separated films. In addition, it is preferable that the reflective filter layer have bank portions that partition regions; and a microphase-separated film that is formed at each of the regions partitioned by the bank portions. More specifically, preferably, the microphase-separated film may be configured to have phases of two or more kinds of polymers which are incompatible with each other and whose reflective indices are different from each other. The regions partitioned by the bank portions of the reflective filter layer may include an R reflective region where a light having a red (R) color is reflected when a white light enters the R reflective region, a G reflective region where a light having a green (G) color is reflected when the white light enters the G reflective region, and a B reflective region where a light having a blue (B) color is reflected when the white light enters the B reflective region; a lattice spacing of the phases of each of the microphase-separated films may be different depending on the R, G, and B reflective regions.

The wavelength characteristic of reflected a light in the microphase-separated film is determined by the lattice spacing of the phases forming the microphase-separated film. Therefore, in the invention, since the lattice spacings in the R, G, and B reflective regions are different, it is possible to obtain an intended reflection characteristic. In other words, it is preferable that the lattice spacings of the microphase-separated films may be set to correspond to the red, green, and blue colors, respectively.

Further, preferably, the electro-optical device may further include an element layer that includes transistors for driving the light-emitting elements, and the reflective filter layer may be disposed between the element layer and the light-emitting layer. The reflective layer may have an insulation property and is formed with contact holes for connecting the transistors and the light-emitting elements. In this case, since the transistors can be arranged below the reflective layer, it is possible to efficiently use the space and to increase the aperture ratio.

Here, preferably, the contact holes may be formed in the bank portions or in the microphase-separated film. Since the microphase-separated film reflects a light, the manufacturing process may be complicated; however, it is possible to make the process simple by forming the contact holes in the bank portion.

Further, preferably, the light-emitting element may have a transparent anode, cathode and a functional layer that emits light by encounters of holes and electrons. For example, the functional layer may include an organic light-emitting diode and an inorganic light-emitting diode.

Further, according to another aspect of the invention, an electronic apparatus includes the above-mentioned electro-optical device. For example, the electronic apparatus includes a mobile phone, a personal computer, a personal digital assistant, an electronic camera, and the like.

Furthermore, according to a further aspect of the invention, a method of manufacturing an electro-optical device includes: forming an element layer including transistors on a substrate; forming bank portions on the element layer; discharging a liquid material into each region partitioned by the bank portions, the liquid material being composed of two or more kinds of polymers which are incompatible with each other and whose reflective indices are different from each other; and forming a light-emitting layer including light-emitting elements on a reflective filter layer, the reflective filter layer being obtained by forming the bank portion on the element layer and by discharging the liquid material into each of the regions partitioned by the bank portion. According to the invention, since the microphase-separated film can be formed by using a discharging method, the configuration of the apparatus becomes very simple and the apparatus has a low manufacturing cost. In addition, since the apparatus discharging a liquid material can manufacture the film in an atmospheric pressure atmosphere, the throughput of the apparatus is high, as compared with a film forming apparatus, such as a CVD apparatus, which performs a film forming process in a decompression atmosphere. Moreover, since its maintenance is simple, the rate of operation of the apparatus can be improved.

BRIEF DESCRIPTION OF THE DRAWINGS

The invention will be described with reference to the accompanying drawings, wherein like numbers reference like elements.

FIG. 6A is a view illustrating a process of manufacturing the electro-optical panel.

FIG. 6B is a view illustrating a process of manufacturing the electro-optical panel.

FIG. 6C is a view illustrating a process of manufacturing the electro-optical panel.

FIG. 7A is a view illustrating a process of manufacturing the electro-optical panel.

FIG. 7B is a view illustrating a process of manufacturing the electro-optical panel.

FIG. 8A is a view illustrating a process of manufacturing the electro-optical panel.

FIG. 8B is a view illustrating a process of manufacturing the electro-optical panel.

FIG. 9 is a cross-sectional view illustrating another structure of the electro-optical panel.

DESCRIPTION OF EXEMPLARY EMBODIMENTS

Electro-Optical Device

Figure 1:
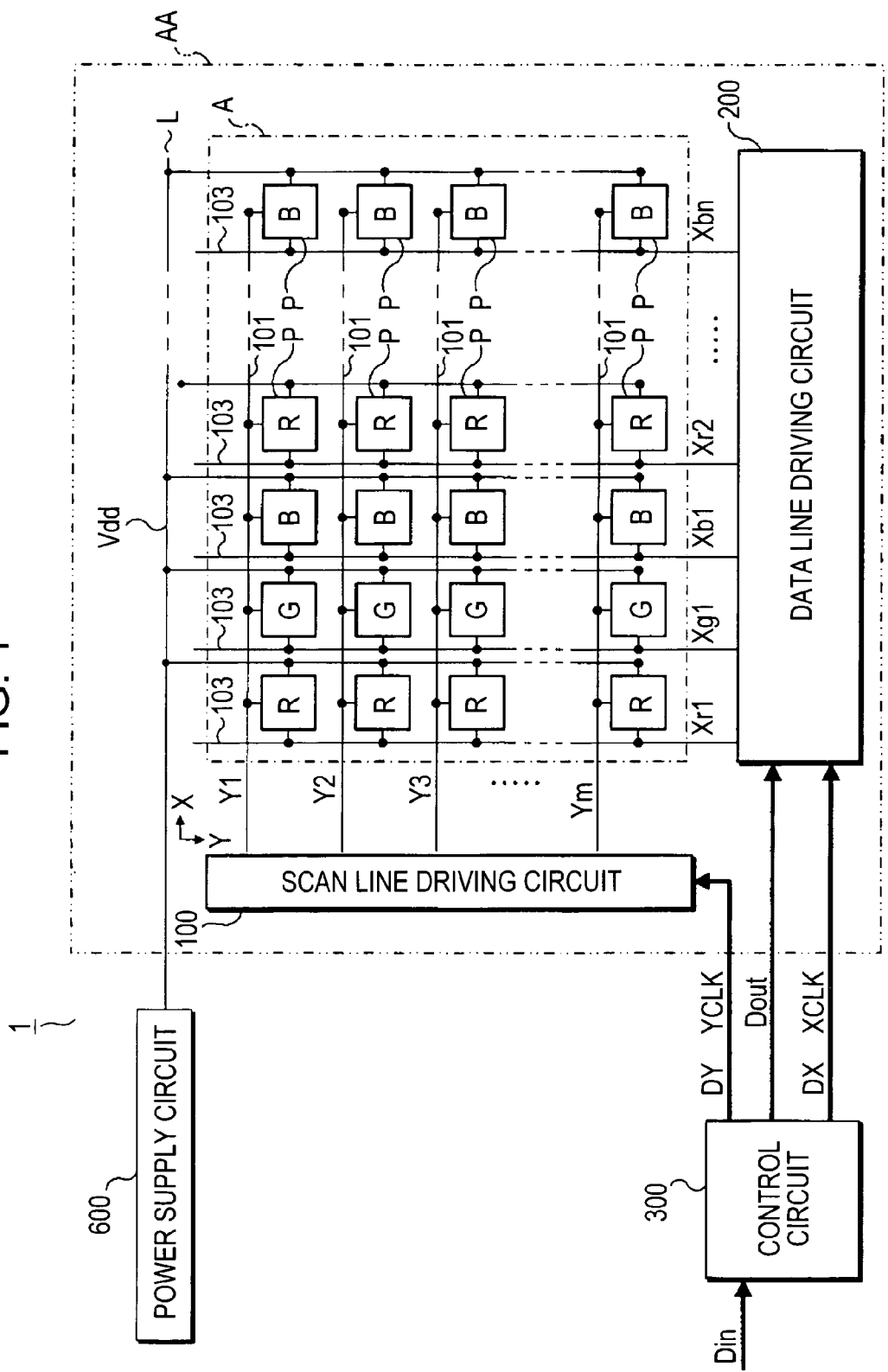
FIG. 1 is a block diagram illustrating the configuration of an electro-optical device according to an embodiment of the invention.

FIG. 1 is a block diagram schematically illustrating the configuration of an electro-optical device according to the invention. The electro-optical device 1 includes an electro-optical panel AA and external circuits. The electro-optical panel AA is formed with a pixel region A, a scanning line driving circuit 100, and a data line driving circuit 200. In the pixel region A, 'm' scanning lines 101 are provided parallel in the X direction and '3n' data lines 103 are provided parallel in the Y direction perpendicular to the X direction. In addition, a pixel circuit P is provided at an intersection between each of the scanning lines 101 and each of the data lines 103.

The pixel circuit P includes an OLED element. The light-emitting color of the OLED element in the present embodiment is a white color. Here, the colors of light emitted from the pixels are red, blue, and green. Reference numerals 'R', 'G', and 'B' shown in the figure denote the light-emitting colors of the pixels, respectively. In the present embodiment, the pixel circuits P, each emitting light having one of the colors, are arranged along the data lines 103. Since the OLED element emits white light, it is not necessary to provide an individual power supply to each of the pixel circuits P each emitting light having one of the RGB colors. For this reason, the power supply voltage Vdd is supplied to each of the pixel circuits P through a common power line L.

The scanning line driving circuit 100 generates scanning signals Y1, Y2, Y3, . . . , and Ym for sequentially selecting a plurality of scanning lines 101 and supplies them to the respective pixel circuits P. The scanning signal Y1 is a pulse having a width corresponding to one horizontal scanning period 1H and is supplied to a scanning line 101 at a first row from an initial timing of one vertical scanning period 1F. Subsequently, the pulse is sequentially shifted to be supplied to scanning lines 101 at second, third, . . . , and m-th rows as the scanning signals Y2, Y3, . . . , and Ym, respectively. In general, when a scanning signal Yi supplied to the scanning line 101 at an i-th row ('i' is an integer in a range of $1 \leq i \leq m$) turns to an H level, the corresponding scanning line 101 is selected.

The data line driving circuit 200 supplies gray-scale signals Xr1, Xg1, Xb1, Xr2, Xg2, Xb2, . . . , Xrn, Xgn, and Xbn to the pixel circuits P located at the selected scanning line 101, respectively. In the present embodiment, each of the gray-scale signals Xr1 to Xbn is applied as a voltage signal that indicates the gray-scale brightness. Further, in the following description, subscripts 'r', 'g', and 'b' correspond to red, green, blue colors, respectively.

A control circuit 300 generates various control signals and outputs them to the scanning line driving circuit 100 and the data line driving circuit 200. A Y transmission starting pulse DY is a pulse that indicates the starting of a scanning in the vertical direction, and the scanning line driving circuit 100 sequentially transmits the Y transmission starting pulses DY to generate scanning signals Y1, Y2, Y3, . . . , and Ym. A Y clock signal YCLK is a signal serving as a time reference of the vertical scanning. On the other hand, an X transmission starting pulse DX is a pulse that indicates the starting of a scanning in the horizontal direction, and the data line driving circuit 200 sequentially transmits the X transmission starting pulses DX to generate timing signals that indicate the timings when the gray-scale signals Xr1, Xg1, Xb1, Xr2, Xg2, Xb2, . . . , Xrn, Xgn, and Xbn are output to the data lines 103 and then outputs gray-scale signals to the data lines 103 by using the timing signals. An X clock signal XCLK is a signal serving as a time reference of the horizontal scanning. In addition, the control circuit 300 performs gamma correction or the like on input image data Din to generate output image data Dout and then outputs the output image data Dout to the data line driving circuit 200.

Figure 2:
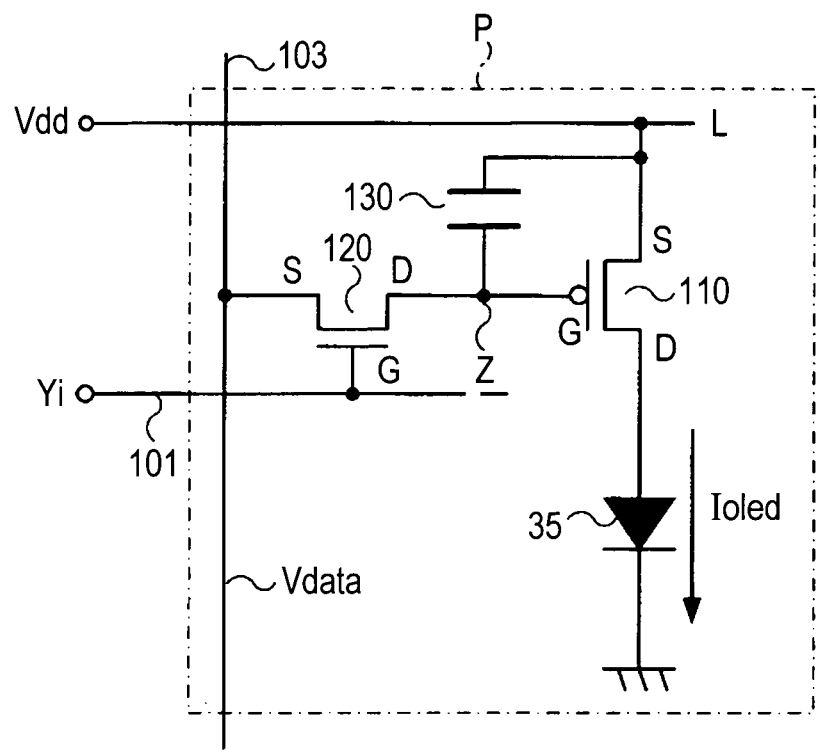
FIG. 2 is a circuit diagram illustrating the configuration of a pixel circuit in the electro-optical device according to the embodiment of the invention.

Next, the pixel circuit P will be described. FIG. 2 is a circuit diagram illustrating the pixel circuit P. The pixel circuit P shown in FIG. 2 corresponds to the i-th row and is supplied with the power supply voltage Vdd. The pixel circuit P includes two thin film transistors 110 and 120 (hereinafter, simply referred to as 'TFT'), a capacitive element 130, and an OLED element 35. A source electrode of the p-channel TFT 110 is connected to the power line L and a drain electrode thereof is connected to an anode of the OLED element 35. Further, the capacitive element 130 is provided between the source electrode and a gate electrode of the TFT 110. A gate electrode of the TFT 120 is connected to the scanning line 101, a source electrode thereof is connected to the data line 103, a drain electrode thereof is connected to the gate electrode of the TFT 110.

In the configuration, since the n-channel TFT 120 is turned on when the scanning signal Yi turns to an H level, the voltage at a connection point z becomes equal to the voltage Vdata. At this time, a charge corresponding to Vdd-Vdata is accumulated in the capacitive element 130. Further, when the scanning signal Yi turns to an L level, the TFT 120 is turned off. Since the input impedance of the gate electrode of the TFT 110 is extremely high, a state in which the charge is accumulated in the capacitive element 130 does not change. Therefore, the gate-to-source voltage of the TFT 110 holds a voltage (Vdd-Vdata) when the voltage Vdata has been applied. In addition, since the current Ioled flowing through the OLED element 35 is determined by the gate-to-source of the TFT 110, the current Ioled according to the voltage Vdata flows through the OLED element 35.

Figure 3:
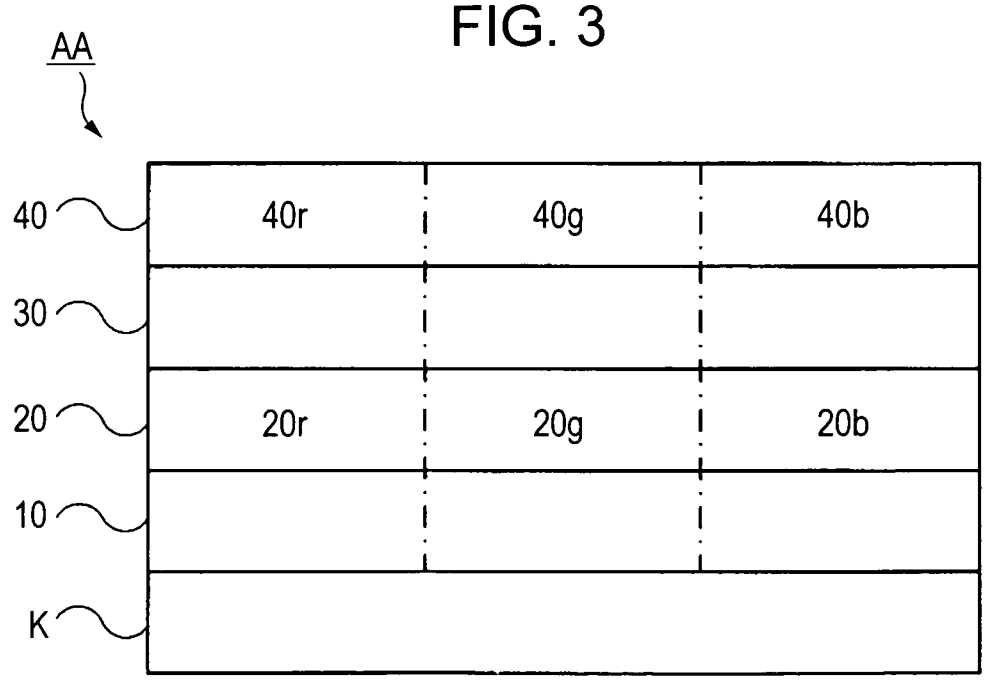
FIG. 3 is a cross-sectional view schematically illustrating the structure of an electro-optical panel used in the electro-optical device according to the embodiment of the invention.

Next, the structure of the electro-optical panel AA will be described. FIG. 3 is a view schematically illustrating the cross section of the electro-optical panel AA. The electro-optical panel AA includes a substrate K, a first layer 10, a second layer 20, a third layer 30, and a fourth layer 40. The first layer 10 is formed with the TFT 110, the TFT 120, the capacitive element 130, and the like. The second layer 20 is provided with a reflective color filter. The reflective color filter has an R reflective region 20r for reflecting a red light component, a G reflective region 20g for reflecting a green light component, and a B reflective region 20b for reflecting a blue light component. These reflective regions 20r, 20g, and 20b are constituted by a microphase-separated film. The microphase-separated film is configured to have phases of two or more kinds of polymers, which are incompatible with each other and whose reflective indices are different from each other, and has the function for reflecting light having a predetermined wavelength and an insulating function.

Figure 4:
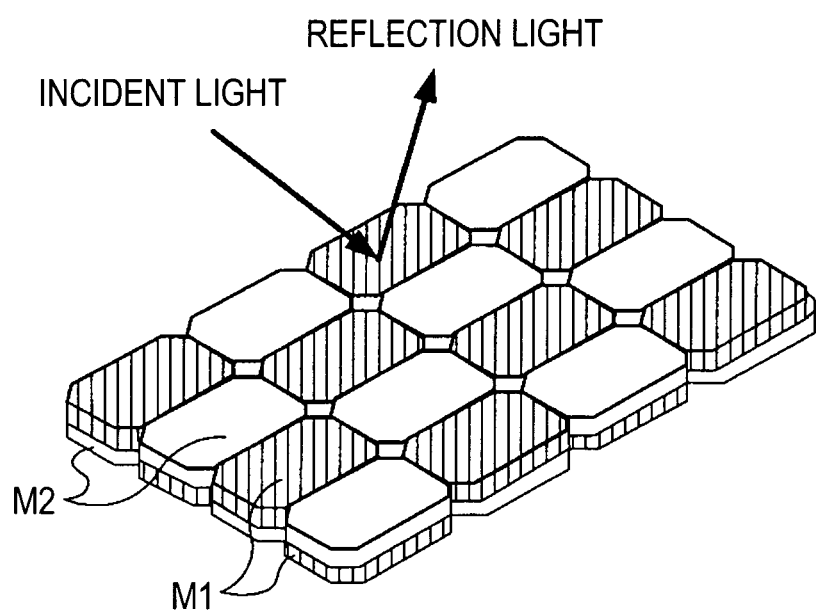
FIG. 4 is a perspective view schematically illustrating the structure of a microphase-separated film.

FIG. 4 is a view schematically illustrating the structure of the microphase-separated film. The microphase-separated film is composed of material phases M1 and M2. The material phases M1 and M2 are made of materials which are incompatible with each other, respectively, and a polymeric structure (polymer) is preferably used as the material of each of the material phases M1 and M2. For example, the phase separation structure can be obtained by adding a homopolymer (polymeric structure) that is composed of either a first repetition unit (first block) or a second repetition unit (second block) of a block copolymer including the first repetition unit and the second repetition unit. In addition, the sizes of the phases or the distance between the phases in the phase separation structure can be set by suitably selecting the kind of block copolymer, the amount of homopolymer, or the like. In other words, the kind of block copolymer or the amount of homopolymer or the like can be selected according to an intended color of light to be emitted.

Suitable block copolymers include, for example, a block copolymer composed of polystyrene and polyisoprene, and a block copolymer composed of poly (2-vinylpyridine) and polyisoprene. Further, a block copolymer composed of polymethyl methacrylate (PMMA) and polyisoprene or polybutadiene is also included therein. Among them, the block copolymer and the homopolymer, both having high solubility in the solvent to be used, are preferable.

Further, specific examples of the block copolymer or the graft copolymer include, for example, a polymer chain obtained by polymerizing at least one kind of the monomers selected from vinylnaphthalene, styrene or a derivative thereof as an aromatic ring-containing polymer chain; and a polymer chain obtained by polymerizing at least one kind of the monomers selected from acrylic acid, methacrylic acid, crotonic acid or a derivative thereof such as polyacrylic acid, polymethyl methacrylate, poly t-butylmethacrylate and the like as a acrylic polymer chain. For the polyether chain, polyalkylene oxide chains such as polyethylene oxide, polypropylene oxide and the like are preferable. For the polysilane chain, a dialkyl polysilane derivative such as polydibutylsilane is preferable.

Further, specific examples of combination of the block chains in the above described block copolymer or the above described graft copolymer include the following. For example, the following may also be a combination of a polystyrene chain and a polymethyl methacrylate chain, a combination of a polystyrene chain and a polyacrylic acid chain, a combination of a polystyrene chain and a polyethylene oxide chain, a combination of a polystyrene chain and a polypropylene oxide chain, a combination of a polystyrene chain and a polyphenylmethylsilane chain, a combination of a polystyrene chain and a polydibutylsilane chain, a combination of a polyvinylnaphthalene chain and a polymethyl methacrylate chain, a combination of a polyvinylnaphthalene chain and a polyacrylic acid chain, a combination of a polyvinylnaphthalene chain and a polyethylene oxide chain, a combination of a polyvinylnaphthalene chain and a polypropylene oxide chain, a combination of a polyvinylnaphthalene chain and a polyphenylmethylsilane chain, a combination of a polyvinylnaphthalene chain and a polydibutylsilane chain, or the like.

An element substrate having a film having the phase separation structure is formed by the following method, for example. First, a block copolymer is mixed with a homopolymer that is compatible with one side of each of the block chains (polymer chains) forming the block copolymer. A liquid material L1 generated by the mixing is heated at a temperature above 'order-to-disorder transition temperature (TODT)' of the block copolymer system to be melted or is dissolved in a common solvent, thereby forming a completely mixed liquid material L2 which is in a disorderly mixed state.

By lowering the temperature of the heated liquid material L2 below the TODT or by evaporating the solvent, an orderly structure is formed. As a result, a microphase-separated structure is formed which is composed of polymer phases (blocked chain phases) each having a lattice spacing of more than 100 nm. According to the method, it is possible to control the lattice spacing by adjusting the amount of homopolymer to be added, and to change the wavelength range of light mainly reflected from the phase separation structure by using the same block copolymer. In addition, it is possible to increase the controlled width of the wavelength range of the light reflected by the phase separation structure by increasing the molecular weight of the block copolymer. That is, the reflected wavelength of the microphase-separated film depends on the lattice spacing of each of the phases constituting the microphase-separated film. The microphase-separated film used for the R, G, and B reflective regions 20r, 20g, and 20b is adjusted such that light having each of the red, green, and blue colors can be reflected with the lattice spacing and the wavelength range thereof.

Referring to FIG. 3 again, the third layer 30 is formed with the OLED element 35 which emits white light, and the fourth layer 40 is formed with a transmissive color filter. The transmissive color filter has an R transmissive region 40r for transmitting a red light component, a G transmissive region 40g for transmitting a green light component, and a B transmissive region 40b for transmitting a blue light component.

In the configuration described above, for example, when the OLED element 35 located in the third layer 30 interposed between the G reflective region 20g and the G transmissive region 40g emits white light, light propagating downward is reflected by the G reflective region 20g to become reflected light having a green color and is then emitted from the G transmissive region 40g. In addition, light propagating upward is transmitted through the G transmissive region 40g to be emitted as green light. This can be applied to the red and blue colors in the same manner.

Figure 5:
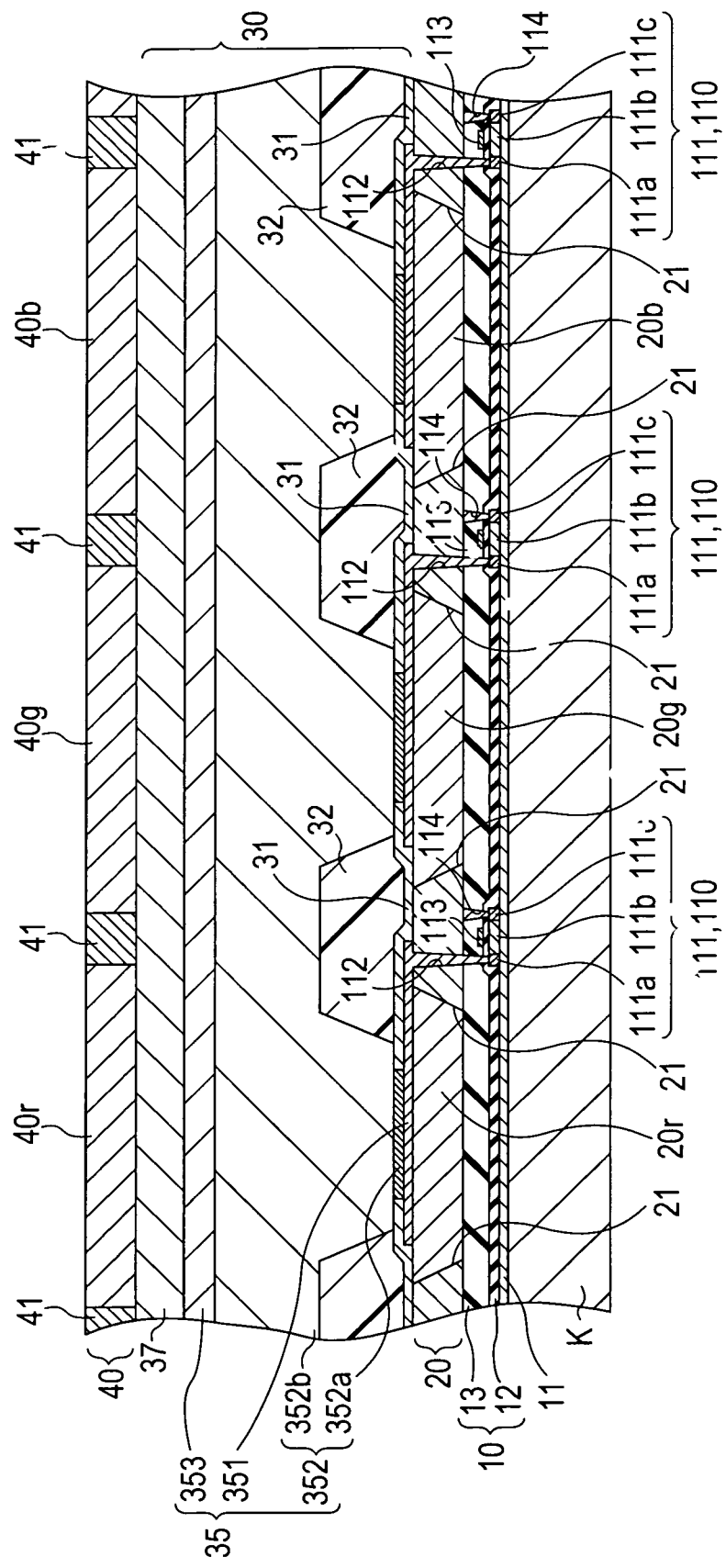
FIG. 5 is a cross-sectional view illustrating the detailed structure of the electro-optical panel.

FIG. 5 is a cross-sectional view illustrating the detailed structure of the electro-optical panel AA. TFTs 110 are provided on a surface of the substrate K with a base protection layer 11, which is mainly made of $SiO_2$, interposed therebetween. Further, the first layer 10 is formed with TFTs 120, capacitive element 130, and the like, as well as the TFTs 110. A silicon layer 111 is formed on the base protection layer 11. For this reason, the TFTs 110 become n-channel transistors. A gate insulation film 12 is provided on the base protection layer 11 so as to cover the silicon layer 111. Gate electrodes 113 are correspondingly provided on portions opposite to the silicon layer 111 on the gate insulation layer 12. The silicon layer 11 is doped with a V-group element through the gate electrodes 113 so as to form a drain region 111a and a source region 111c. Here, regions where the V-group element is not doped become channel regions 111b. A first interlayer insulation layer 13 is formed on the gate insulation layer 12 so as to cover the gate electrodes 113. In addition, drain electrodes 112 are connected to the corresponding drain regions 111a through contact holes which are open through the gate insulation layer 12, the first interlayer insulation layer 13, and the second layer 20. On the other hand, source electrodes 114 are provided opposite to the drain electrodes 112 with the gate electrodes 113 interposed therebetween and are connected to the corresponding source regions 111c through contact holes which are open through the gate insulation layer 12 and the first interlayer insulation layer 13.

The second layer 20 has the R reflective region 20r, the G reflective region 20g, and the B reflective region 20b that are partitioned by bank portions 21. The regions are composed of the above-mentioned microphase-separated film. In the present embodiment, the TFTs 110 are provided below the bank portions 21. This is to prevent other light components than the reflected light component from being incident on the TFTs 110 so as not to cause the TFTs 110 to malfunction. In addition, the TFTs 110 may be covered with a light shielding film, or the TFTs 110 may be formed below the reflective regions 20r, 20g, and 20b if the amount of incident light does not matter.

In the present embodiment, the drain electrodes 112 of the TFTs 110 are provided by forming the contact holes in the bank portions 21. The contact holes need to be formed in the second layer 20 in order to make an electrical connection between the first layer 10 and the third layer 30. However, since the microphase-separated film has a property to reflect light, it is not easy to form the contact holes in the reflective regions 20r, 20g, and 20b. For this reason, the drain electrodes 112 are provided by forming the contact holes in the bank portions 21. Alternatively, if it is allowed that the manufacturing process becomes complicated, the contact holes may be formed in the reflective regions 20r, 20g, and 20b.

Next, the OLED element 35 is formed in the third layer 30. The OLED element 35 has an anode 351, a functional layer 352, and a cathode 353. On the second layer 20, the anodes 351 are formed so as to be connected to the drain electrodes 112 and inorganic bank layers 31 are formed so as to be laid across the anodes 351. Further, an organic bank layer 32 is stacked on the inorganic bank layer 31. The periphery of the anode 351 and the inorganic bank layer 31 are arranged to overlap each other in plan view. Furthermore, similar to the inorganic bank layer 31, the organic bank layer 32 is also arranged to overlap a part of the anode 351 in plan view. In addition, the inorganic bank layer 31 is formed to be closer to the central side of the anode 351 than the organic bank layer 32 is. For the inorganic bank layer 31, inorganic materials, such as $SiO_2$, $TiO_2$, or the like, are preferably used.

Preferably, the film thickness of the inorganic bank layer 31 is in a range of 50 to 200 nm, but most preferably it is 150 nm. If the film thickness is below 50 nm, the inorganic bank layer 31 is thinner than a hole injection/transportation layer 352a to be described below, such that the flatness of the hole injection/transportation layer 352a cannot be secured, which is not desirable. In addition, if the film thickness exceeds 200 nm, the step difference due to a lower opening portion becomes large, such that it is not difficult to secure the flatness of a light-emitting layer 352b, which will be described below, stacked on the hole injection/transportation layer 352a, which is not desirable.

For the organic bank layer 32, a material having heat resistance and solvent resistance, such as acrylic resin, polyimide resin, or the like, is preferably used. Preferably, the thickness of the organic bank layer 32 is in a range of 0.1 to 3.5 μm, but most preferably it is about 2 μm. If the thickness is below 0.1 μm, the organic bank layer 32 is thinner than the thickness obtained by summing a hole injection/transportation layer and a light-emitting layer to be described below, such that the light-emitting layer may overflow from an upper opening portion, which is not desirable. In addition, if the thickness exceeds 3.5 μm, the step difference due to the upper opening portion becomes large, such that it is difficult to secure the step coverage of the cathode 353 formed on the organic bank layer 32, which is not desirable.

The functional layer 352 is composed of the hole injection/transportation layer 352a stacked on the anode 351, and the light-emitting layer 352b formed to be adjacent to the hole injection/transportation layer 352b. Further, if needed, other functional layers functioning as an electron injection/transportation layer or the like may be formed. The hole injection/transportation layer 352a functions to inject holes into the light-emitting layer 352a and to transport the holes within the hole injection/transportation layer 352b. By providing the hole injection/transportation layer 352a between the anode 351 and the light-emitting layer 352b, it is possible to improve element characteristics, such as the light-emitting efficiency and the lifetime, of the light-emitting layer 352b. Further, in the light-emitting layer 352b, the holes injected from the hole injection/transportation layer 352a and the electrons injected from the cathode 353 are recombined so as to emit light. In the present embodiment, the light-emitting layer 352b emits white light.

The cathode 353 is formed on the entire surface of the functional layer 352, and the cathode 353 and the anode 351 provided opposite to the cathode 353 serve to make a current flow into the functional layer 352. For the cathode 353, a transparent and conductive material may be used. For example, materials constituting the cathode 353 include ITO, Pt, Ir, Ni, Mg, Ag, or Pd. Among them, it is preferable to use the ITO which can be formed by using an inkjet method. Further, on the cathode 353 is provided a sealing portion composed of a sealing substrate 37. The sealing portion is formed on the entire surface of the cathode 353 in order to prevent oxidation or damage due to an external force.

The fourth layer 40 is partitioned in a lattice pattern by a black matrix 41, and the R, G, and B transmissive regions 40r, 40g, and 40b are formed in the partitioned regions.

Next, a method of manufacturing the electro-optical panel AA will be described.

FIGS. 6A to 8B illustrate a process of manufacturing the electro-optical panel AA. First, as shown in FIG. 6A, the base protection layer 11 having an insulation property is formed on the substrate K. For the substrate K, a glass substrate, a glass-ceramic substrate, a quartz substrate, a silicon substrate, a ceramic substrate, a metal substrate, or a plastic substrate may be used. Then, the silicon layer 111 is formed on the base protection layer 11. Thereafter, the gate insulation layer 12 is stacked thereon. The thickness of the gate insulation layer 12 is preferably in a range of 100 to 150 nm. Subsequently, the drain region 111a and the source region 111c are formed in the silicon layer 111 by performing a doping process through the upper surface of the gate insulation layer 12. In addition, the gate electrodes 113 are formed on the gate insulation layer 12.

Thereafter, as shown in FIG. 3B, the first interlayer insulation layer 13 is stacked. Then, the contact holes each of which is open through the gate insulation layer 12 and the first interlayer insulation layer 13 are formed, and the source electrodes 114 are formed so as to be connected to the corresponding source regions 111c. Next, the bank portions 21 are formed, and then the reflective regions 20r, 20g, and 20b composed of the microphase-separated film are formed in the regions partitioned by the bank portions 21.

In order to form the microphase-separated film in the regions partitioned by the bank portions 21 as in the present embodiment, it is preferable to use a liquid coating method, which is called as a material discharging method, that is, a so-called inkjet method. In the liquid coating method, the substrate K is fixed on a stage by using a vacuum suction method, and the liquid material is discharged into the regions partitioned by the bank portions 21 by using a movable head located above the substrate K. The head has the same structure as a head used in an inkjet printer and is driven by a piezoelectric element. The microphase-separated film that reflects light having the respective colors can be formed by discharging the liquid material into the R reflective region 20r, the G reflective region 20g, and the B reflective region 20b. After the liquid material is discharged into the respective regions, the microphase-separated film is formed through a drying process. In the inkjet method, the configuration of an apparatus is very simple and the apparatus has a low manufacturing cost, as compared with a known film forming method in which a film forming apparatus, such as a CVD apparatus using a vacuum process, is used. Since an apparatus used in the coating method of the liquid material L2 can manufacture the film in an atmospheric pressure atmosphere, the throughput of the apparatus is high, as compared with the film forming apparatus, such as the CVD apparatus, which performs a film forming process in a decompression atmosphere, and the rate of operation of the apparatus can be improved due to its simple maintenance.

Then, as shown in FIG. 7A, the contact holes are formed in the bank portion 21, the first interlayer insulation layer 13, and the gate insulation layer 12, and the drain electrodes 112 and the anode 351 of the OLED element 35 are integrally formed. Thereafter, the inorganic bank layer 31 and the organic bank layer 32 are formed. Then, as shown in FIG. 7B, the hole injection/transportation layer 352a is formed and then the light-emitting layer 352b is formed. These are formed by using a spin-coating method or an evaporation method. Further, the cathode 353 is formed so as to cover the entire surface. For the cathode 353, for example, ITO is used.

Subsequently, as shown in FIG. 8A, the sealing substrate 37 is adhered onto the cathode 353. Then, as shown in FIG. 8B, the black matrix 41 is patterned. For the black matrix 41, a material, such as a carbon or a metal, having a light-shielding property is used. Then, the colored liquid material is discharged in each of the R transmissive region 40r, the G transmissive region 40g, and the B transmissive region 40b partitioned in a lattice pattern by the black matrix 41, by the inkjet method, thereby forming a color filter.

FIG. 9 illustrates another structure of the electro-optical panel AA. The structure of the electro-optical panel AA is the same as that of the electro-optical panel AA shown in FIG. 4, except that the organic bank layer 32 is not provided in the third layer 30. Since the organic bank layer 32 does not exist, irregularities are not easily generated when the light-emitting layer 352b is formed by the spin-coating method or the evaporation method.

Figure 10:
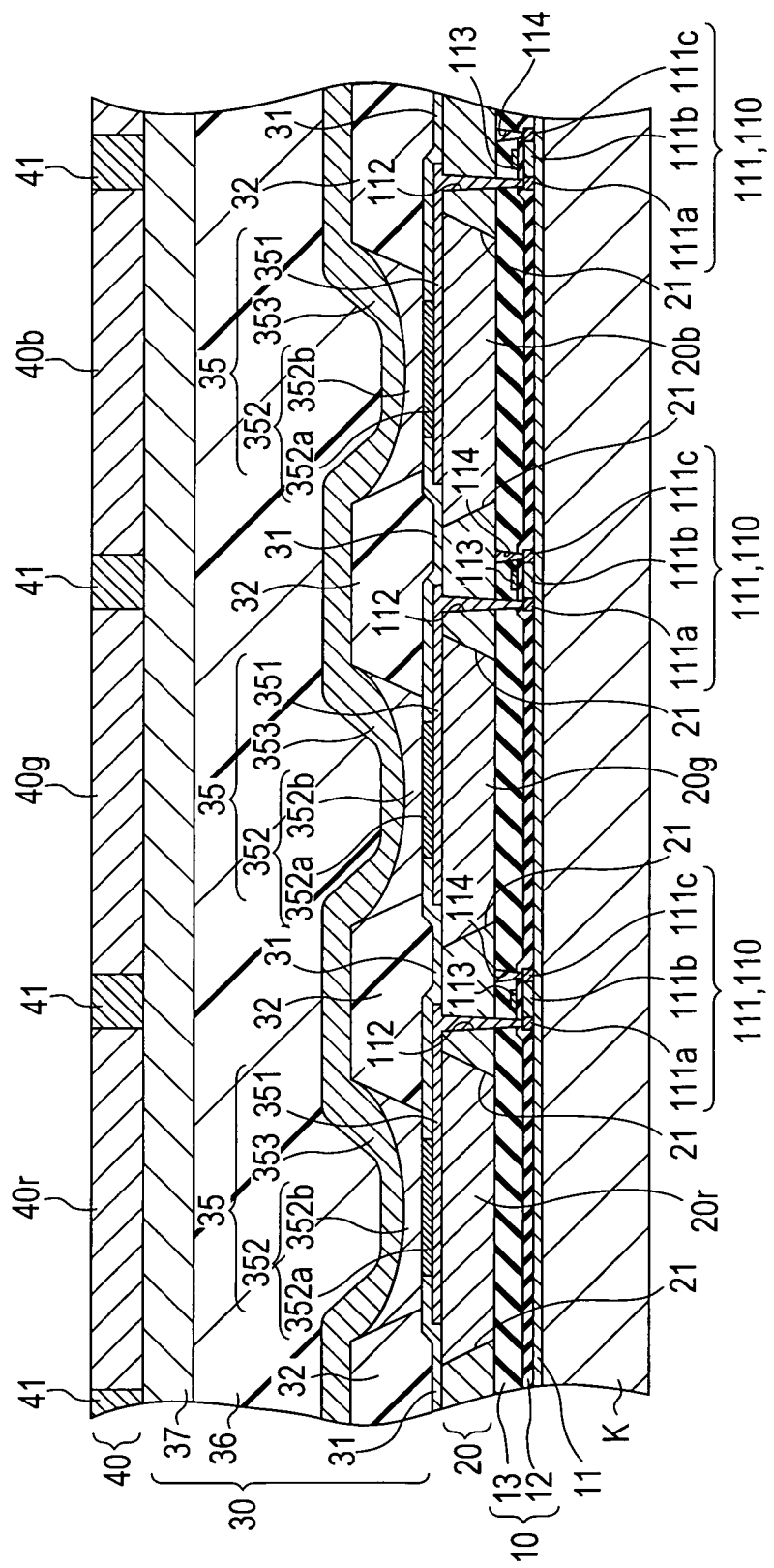
FIG. 10 is a cross-sectional view illustrating still another structure of the electro-optical panel.

FIG. 10 illustrates still another structure of the electro-optical panel AA. The electro-optical panel AA is different from the above-described electro-optical panels AA in that the cathode 351 is provided on the organic bank layer 32 and a sealing resin 36 is provided between the cathode 351 and the sealing substrate 37 in the third layer 30. In this case, the functional layer 352 is preferably formed by using the inkjet method described above.

The second layer 20 in which the reflective color filter is formed is preferably formed opposite to the fourth layer 40 in which the transmissive color filter is formed, as seen from the third layer 30 in which the OLED element 35 is formed. For this reason, it may be possible to provide the second layer 20 below the substrate K and to provide the third layer 30 on the first layer 10.

Electronic Apparatus

Figure 11:
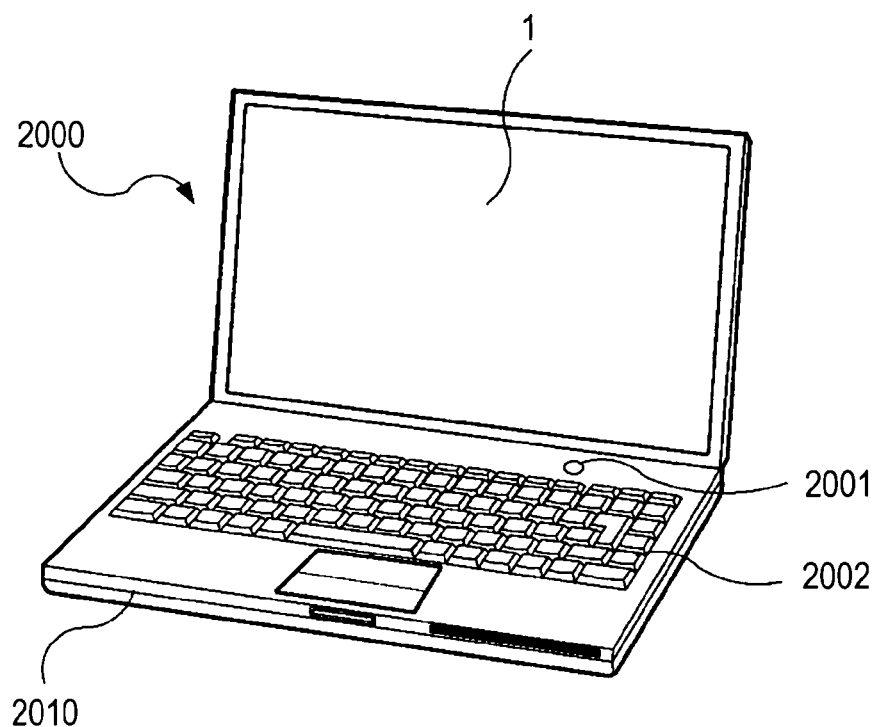
FIG. 11 is a perspective view illustrating the configuration of a personal computer to which the electro-optical device is applied.

Next, an electronic apparatus to which the above-described electro-optical device 1 is applied will be described. FIG. 11 illustrates the configuration of a portable personal computer to which the electro-optical device 1 is applied. The personal computer 2000 includes the electro-optical device 1 serving as a display unit and a main body 2010. The main body 2010 is provided with a power switch 2001 and a keyboard 2002. Since the electro-optical device 1 uses the OLED element 35, it is possible to display a screen having a wide viewing angle.

Figure 12:
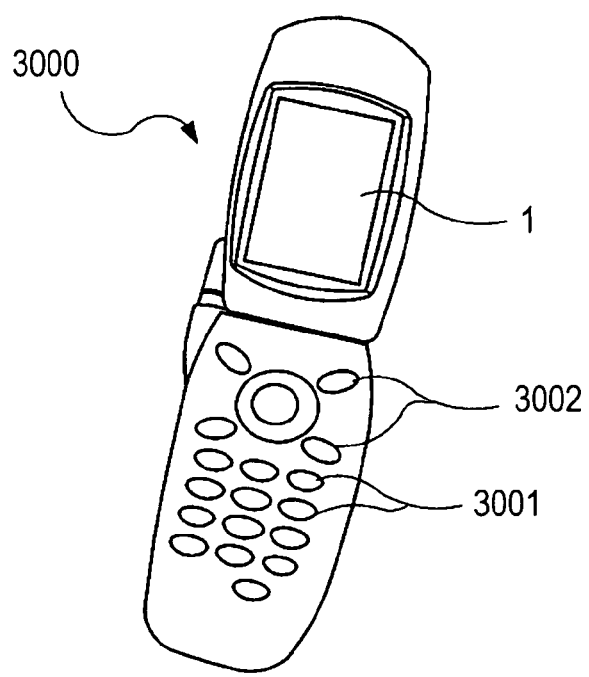
FIG. 12 is a perspective view illustrating the configuration of a mobile phone to which the electro-optical device is applied.

FIG. 12 illustrates the configuration of a mobile phone to which the electro-optical device 1 is applied. The mobile phone 3000 includes a plurality of operation buttons 3001 and scroll buttons 3002, and the electro-optical device 1 serving as a display unit. By operating the scroll buttons 3002, a screen displayed on the electro-optical device 1 is scrolled.

Figure 13:
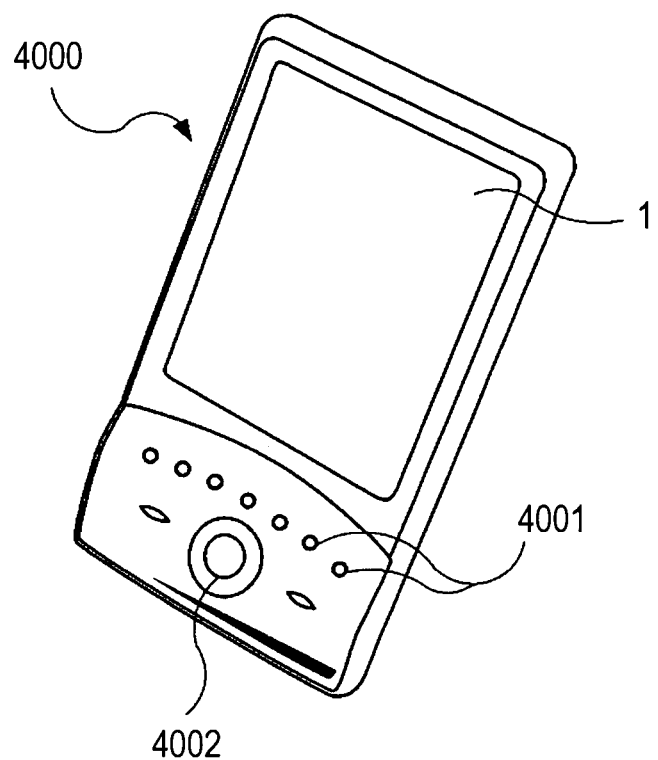
FIG. 13 is a perspective view illustrating the configuration of a personal digital assistant to which the electro-optical device is applied.

FIG. 13 illustrates the configuration of a personal digital assistant (PDA) to which the electro-optical device 1 is applied. The personal digital assistant 4000 includes a plurality of operation buttons 4001, a power switch 4002, and the electro-optical device 1 serving as a display unit. By operating the power switch 4002, various information items, such as an address list, a schedule note, or the like, are displayed on the electro-optical device 1.

Further, an electronic apparatus to which the electro-optical device 1 is applied includes a digital still camera, a liquid crystal television, a view-finder-type or monitor-direct-view-type video tape recorder, a car navigation apparatus, a pager, an electronic diary, a desktop calculator, a word processor, a workstation, a video phone, a POS terminal, an apparatus having a touch panel, and the like, as well as those shown in FIGS. 11 to 13.

What is claimed is:

1. An electro-optical device comprising:
an OLED element that has a cathode, an anode, and a light-emitting layer that emits white light and is sandwiched between the cathode and the anode;
a TFT connected to the OLED element;
a reflective color filter that reflects light emitted by the light-emitting layer; and
a transparent color filter that transmits the light emitted by the light-emitting layer;
wherein the OLED element is arranged between the reflective color filter and the transparent color filter;
wherein the reflective color filter has a plurality of bank portions each having a trapezoidal shape that partition a plurality of regions and a plurality of microphase-separated films are disposed in the regions partitioned by the bank portions;
wherein a microphase-separated film of the plurality of films is constituted by phases of two or more types of polymers that are incompatible with each other and whose indices of refraction are different from each other;
wherein the OLED element and the TFT are connected through a contact hole formed in one of the plurality of bank portions, and
wherein the transparent color filter is partitioned in a lattice pattern by a black matrix.

2. The electro-optical device as set forth in claim 1,
wherein the bank portions partition the reflective color filter into an R reflective region reflecting R light, a G reflective region reflecting G light, and a B reflective region reflecting B light; and
wherein grid intervals of the microphase-separated films are different from each other in the R, G, and B reflective regions.

3. An electronic device comprising an electro-optical device, the electro-optical device comprising:
an OLED element that has a cathode, an anode, and a light-emitting layer that emits white light and is sandwiched between the cathode and the anode;
a TFT connected to the OLED element;
a reflective color filter that reflects light emitted by the light-emitting layer; and
a transparent color filter which transmits the light emitted by the light-emitting layer;
wherein the OLED element is arranged between the reflective color filter and the transparent color filter;
wherein the reflective color filter has a plurality of bank portions each having a trapezoidal shape that partition a plurality of regions and a plurality of microphase-separated films are disposed in the regions partitioned by the bank portions;
wherein a microphase-separated film of the plurality of films is constituted by phases of two or more types of polymers that are incompatible with each other and whose indices of refraction are different from each other;
wherein the OLED element and the TFT are connected through a contact hole formed in one of the plurality of bank portions, and
wherein the transparent color filter is partitioned in a lattice pattern by a black matrix.

* * * * *